(12) United States Patent
Matsuura et al.

(10) Patent No.: US 8,394,200 B2
(45) Date of Patent: Mar. 12, 2013

(54) VERTICAL PLASMA PROCESSING APPARATUS FOR SEMICONDUCTOR PROCESS

(75) Inventors: Hiroyuki Matsuura, Oshu (JP); Toshiki Takahashi, Oshu (JP); Jun Sato, Kai (JP); Katsuyoshi Aikawa, Kai (JP); Katsutoshi Ishii, Kai (JP)

(73) Assignee: Tokyo Electron Limited, Tokyo (JP)

( * ) Notice: Subject to any disclaimer, the term of this patent is extended or adjusted under 35 U.S.C. 154(b) by 1142 days.

(21) Appl. No.: 12/277,344

(22) Filed: Nov. 25, 2008

(65) Prior Publication Data

US 2009/0078201 A1  Mar. 26, 2009

Related U.S. Application Data

(63) Continuation of application No. 11/689,686, filed on Mar. 22, 2007, now abandoned.

(30) Foreign Application Priority Data

Mar. 24, 2006 (JP) ................................. 2006-083579
Mar. 28, 2006 (JP) ................................. 2006-089210

(51) Int. Cl.
C23C 16/505 (2006.01)
(52) U.S. Cl. .................... 118/715; 118/724; 118/725
(58) Field of Classification Search ............... 118/715, 118/724, 725
See application file for complete search history.

(56) References Cited

U.S. PATENT DOCUMENTS

| | | | |
|---|---|---|---|
| 3,589,388 A | 6/1971 | Haneline, Jr. | |
| 4,745,088 A | 5/1988 | Inoue et al. | |
| 4,989,540 A | 2/1991 | Fuse et al. | |
| 4,992,301 A | 2/1991 | Shishiguchi et al. | |
| 5,000,113 A * | 3/1991 | Wang et al. ............... | 118/723 E |
| 5,217,560 A | 6/1993 | Kurono et al. | |
| 5,383,984 A | 1/1995 | Shimada et al. | |
| 6,093,252 A * | 7/2000 | Wengert et al. ............... | 118/719 |
| 6,444,262 B1 * | 9/2002 | Kitamura et al. .......... | 427/248.1 |
| 7,674,336 B2 * | 3/2010 | Honma et al. ................ | 118/715 |
| 7,900,580 B2 | 3/2011 | Kontani et al. | |
| 8,047,158 B2 | 11/2011 | Kontani et al. | |
| 2001/0050054 A1 | 12/2001 | Kwag et al. | |

(Continued)

FOREIGN PATENT DOCUMENTS

CN    1455434 A    11/2003
CN    1716538 A    1/2006

(Continued)

OTHER PUBLICATIONS

Office Action mailed Jul. 12, 2012 in a corresponding application in Taiwan.

(Continued)

*Primary Examiner* — Jeffrie R Lund
*Assistant Examiner* — Satish Chandra
(74) *Attorney, Agent, or Firm* — Oblon, Spivak, McClelland, Maier & Neustadt, L.L.P.

(57) ABSTRACT

A vertical plasma processing apparatus for a semiconductor process includes an airtight auxiliary chamber defined by a casing having an insulative inner surface and integrated with a process container. The auxiliary chamber includes a plasma generation area extending over a length corresponding to a plurality of target substrates in a vertical direction. A partition plate having an insulative surface is located between a process field and the plasma generation. The partition plate includes a gas passage disposed over a length corresponding to the plurality of target substrates in a vertical direction. A process gas is exited while passing through the plasma generation area, and is then supplied through the gas passage to the process field.

18 Claims, 10 Drawing Sheets

U.S. PATENT DOCUMENTS

| | | | |
|---|---|---|---|
| 2001/0054385 A1* | 12/2001 | Horiguchi | 118/723 R |
| 2002/0023589 A1 | 2/2002 | Kondo et al. | |
| 2003/0049372 A1 | 3/2003 | Cook et al. | |
| 2003/0224618 A1 | 12/2003 | Sato et al. | |
| 2004/0025786 A1* | 2/2004 | Kontani et al. | 118/715 |
| 2005/0056220 A1* | 3/2005 | Aoki et al. | 118/722 |
| 2005/0217577 A1 | 10/2005 | Okuda et al. | |
| 2005/0255712 A1 | 11/2005 | Kato et al. | |
| 2005/0287775 A1* | 12/2005 | Hasebe et al. | 438/503 |
| 2006/0260544 A1 | 11/2006 | Toyoda et al. | |
| 2007/0075086 A1* | 4/2007 | Honma et al. | 220/560.13 |
| 2008/0121180 A1 | 5/2008 | Kontani et al. | |
| 2008/0251014 A1 | 10/2008 | Kontani et al. | |
| 2008/0251015 A1 | 10/2008 | Kontani et al. | |
| 2010/0263593 A1 | 10/2010 | Kontani et al. | |

FOREIGN PATENT DOCUMENTS

| | | |
|---|---|---|
| JP | 5-251391 | 9/1993 |
| JP | 6-45256 | 2/1994 |
| JP | 9-283511 | 10/1997 |
| JP | 11-87341 | 3/1999 |
| JP | 2005-277264 | 10/2005 |
| KR | 10-2006-0007375 | 1/2006 |
| TW | 1222677 B | 10/2004 |
| WO | WO 2004/066377 | 8/2004 |

OTHER PUBLICATIONS

Japanese Office Action issued Jul. 5, 2011, in Patent Application No. 2006-089210 (with English-language translation).

Japanese Office Action issued Jul. 12, 2011, in Patent Application No. 2006-083579 (with English-language translation).

Korean Office Action issued Sep. 17, 2010, in Patent Application No. 10-2007-0028415 (with English-language translation).

* cited by examiner

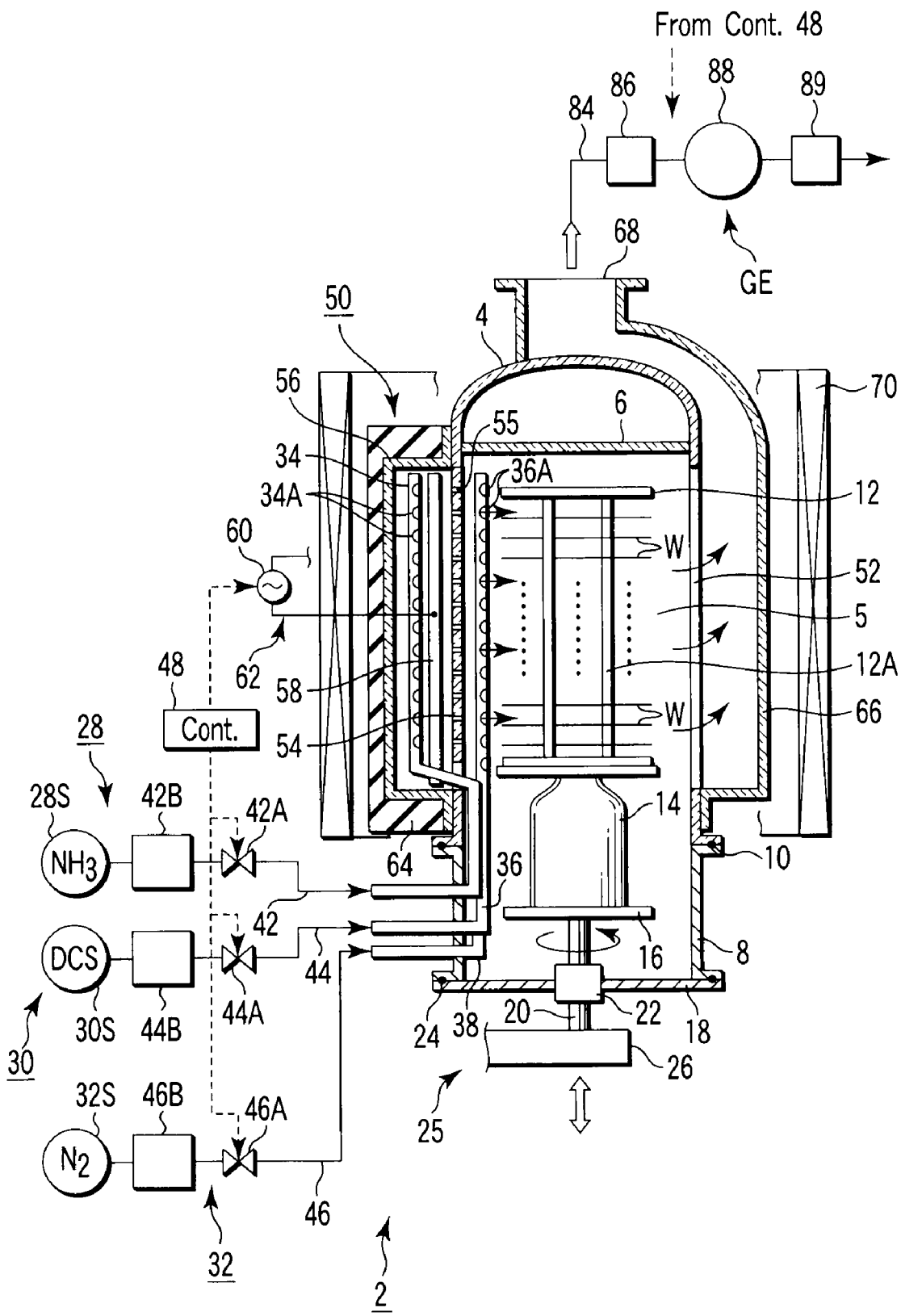
F I G. 1

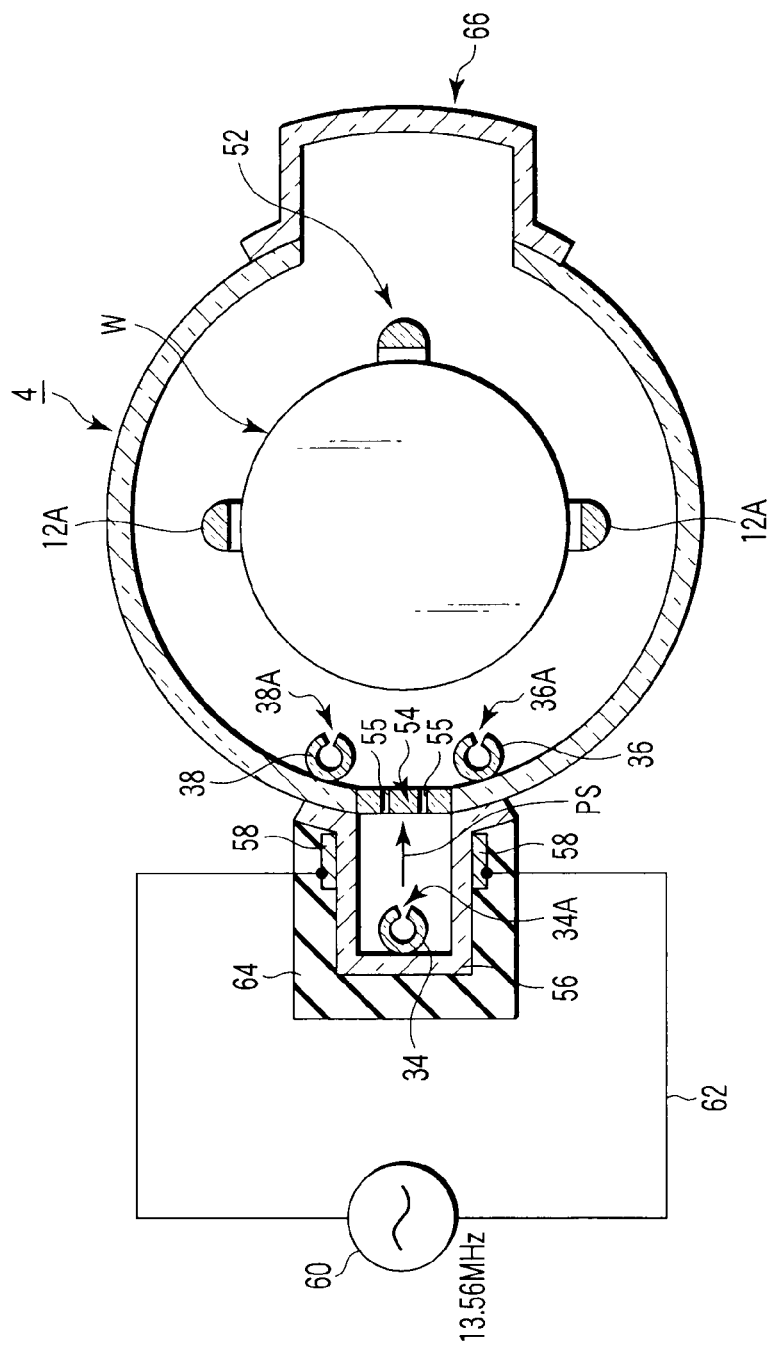
F I G. 2
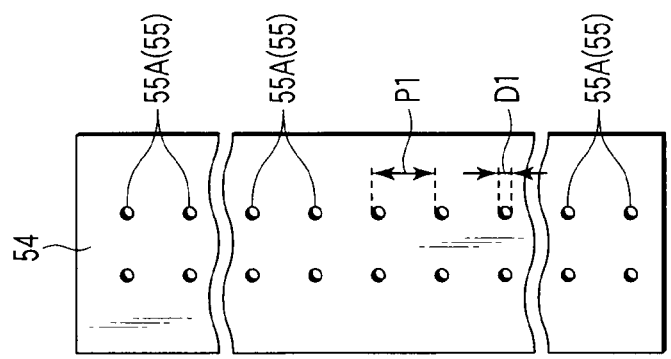
F I G. 3

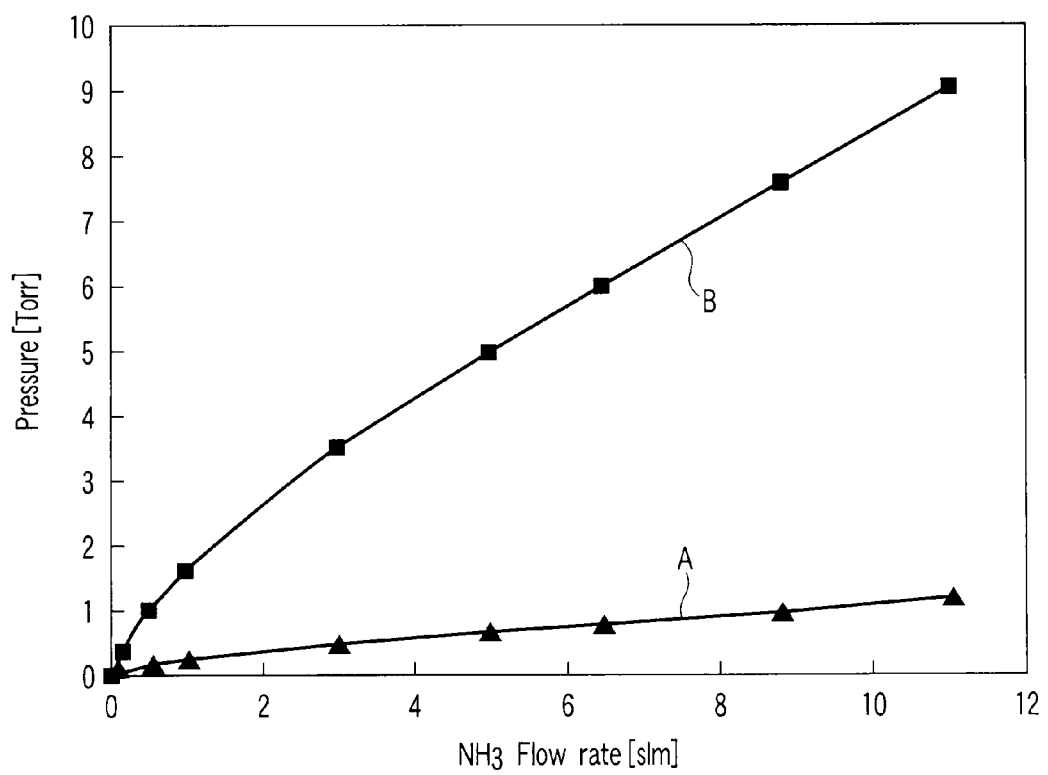
F I G. 7

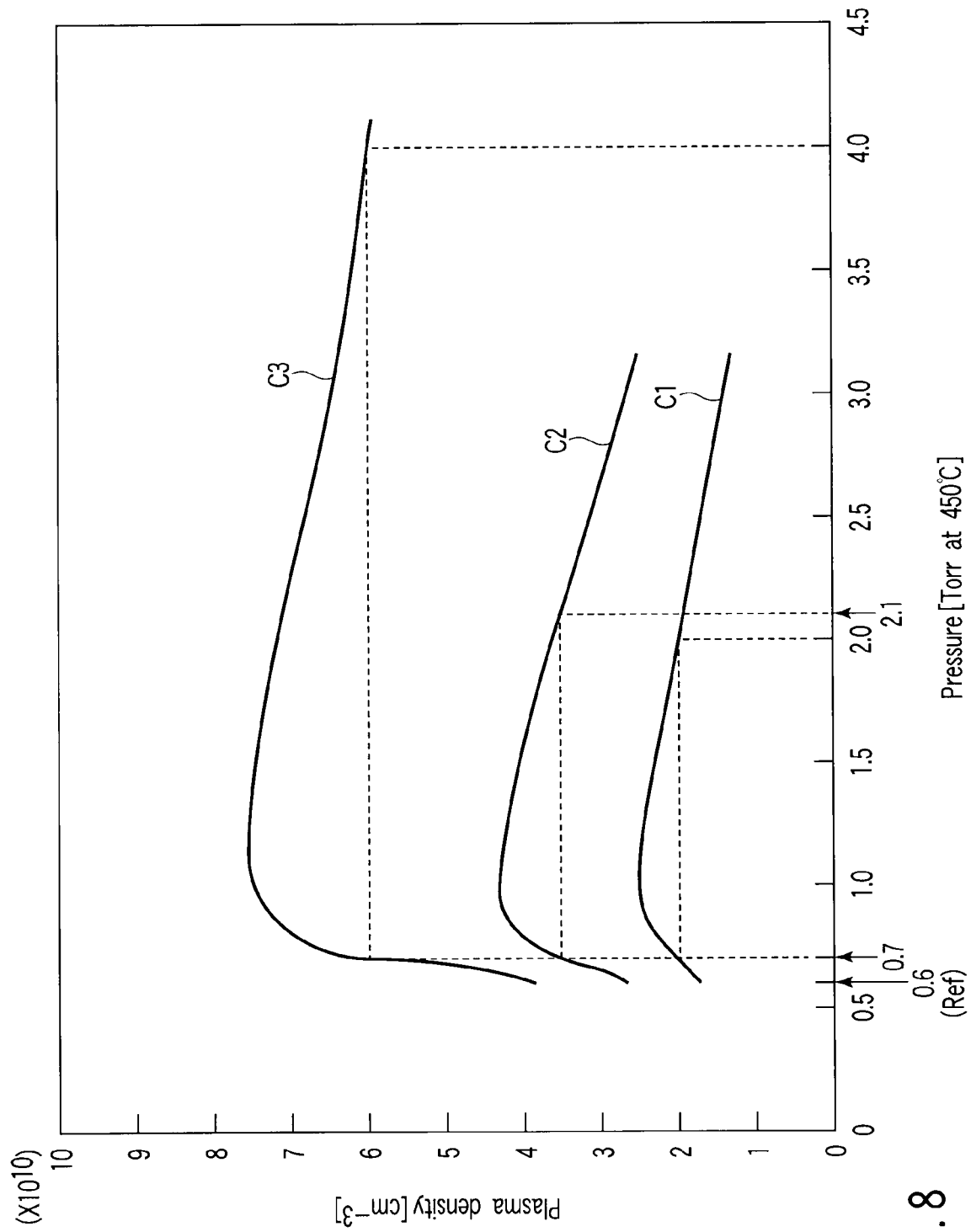
F I G. 8

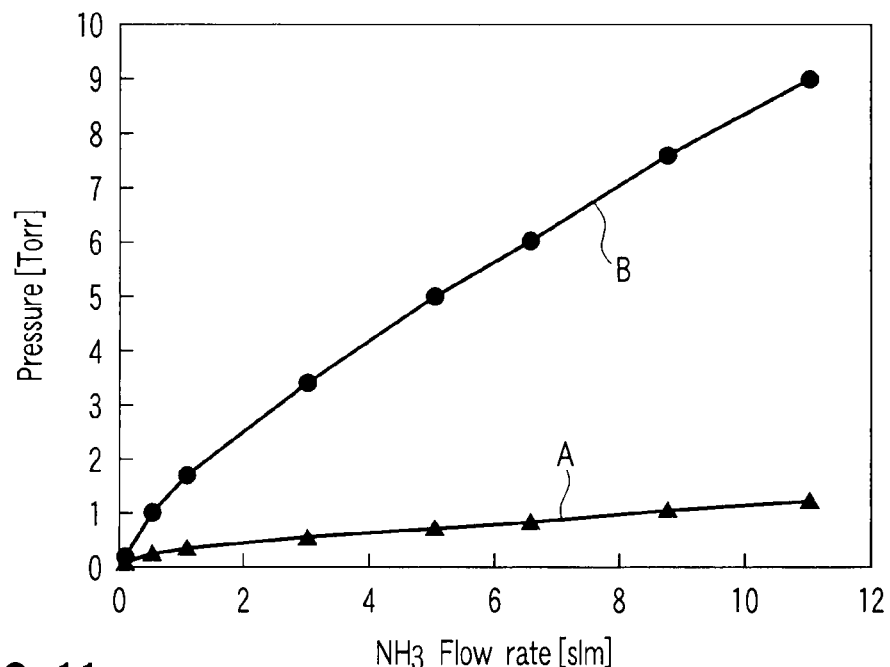
F I G. 11
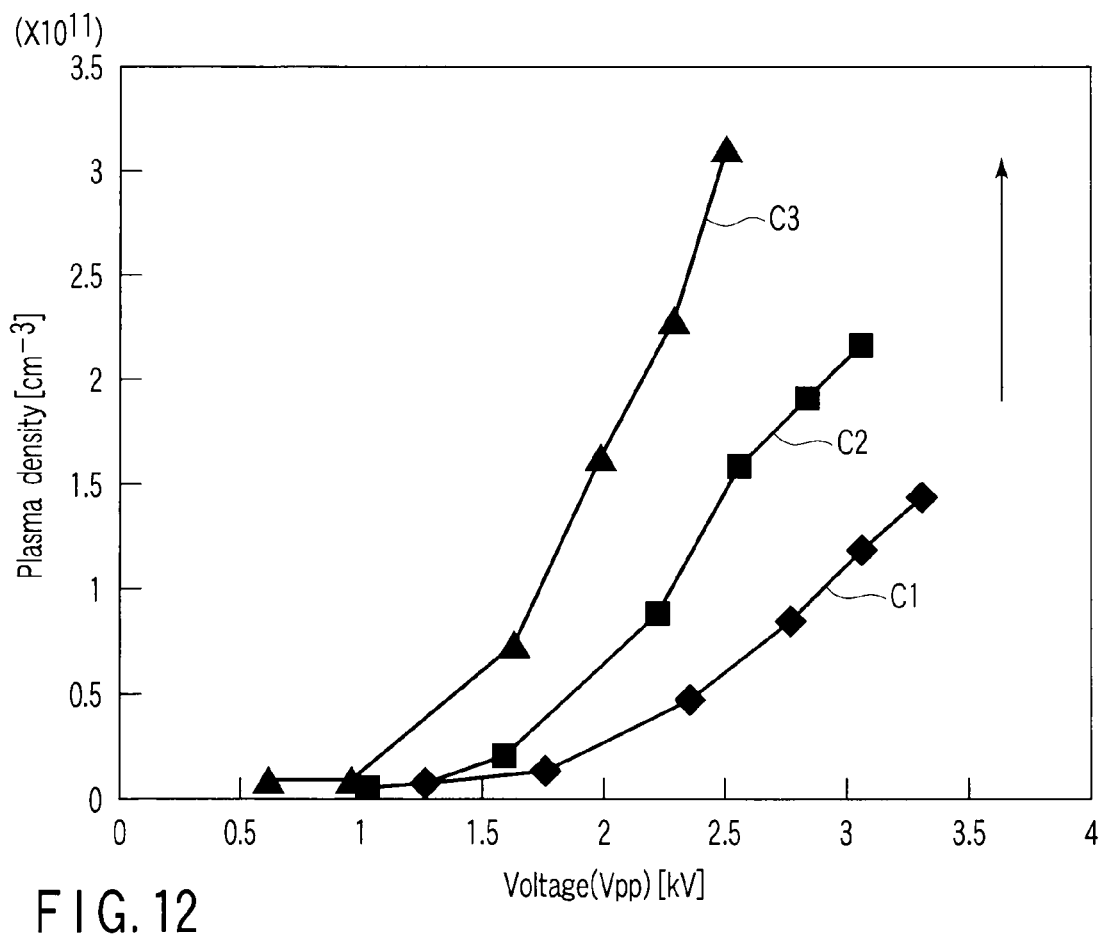
F I G. 12

VERTICAL PLASMA PROCESSING APPARATUS FOR SEMICONDUCTOR PROCESS

CROSS-REFERENCE TO RELATED APPLICATIONS

This application is a continuation of and claims the benefit of priority from U.S. Ser. No. 11/689,686, filed Mar. 22, 2007, and is based upon and claims the benefit of priority from prior Japanese Patent Applications No. 2006-083579, filed Mar. 24, 2006 and No. 2006-089210, filed Mar. 28, 2006, the entire contents of both of which are incorporated herein by reference.

BACKGROUND OF THE INVENTION

1. Field of the Invention

The present invention relates to a vertical plasma processing apparatus for a semiconductor process, such as a vertical plasma film formation apparatus for forming a thin film, such as a silicon-containing insulating film, on a target substrate, such as a semiconductor wafer. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an FPD (Flat Panel Display), e.g., an LCD (Liquid Crystal Display), by forming semiconductor layers, insulating layers, and conductive layers in predetermined patterns on the target substrate.

2. Description of the Related Art

In manufacturing semiconductor devices for constituting semiconductor integrated circuits, a target substrate, such as a semiconductor wafer (made of, e.g., silicon) is subjected to various processes, such as film formation, etching, oxidation, diffusion, reformation, annealing, and natural oxide film removal. US 2003/0224618 A1 discloses a semiconductor processing method of this kind performed in a vertical heat-processing apparatus (of the so-called batch type). According to this method, semiconductor wafers are first transferred from a wafer cassette onto a vertical wafer boat and supported thereon at intervals in the vertical direction. The wafer cassette can store, e.g., 25 wafers, while the wafer boat can support 30 to 150 wafers. Then, the wafer boat is loaded into a process container from below, and the process container is airtightly closed. Then, a predetermined heat process is performed, while the process conditions, such as process gas flow rates, process pressures, and process temperatures, are controlled.

In recent years, owing to the demands of increased miniaturization and integration of semiconductor integrated circuits, it is required to alleviate the thermal history of semiconductor devices in manufacturing steps, thereby improving the characteristics of the devices. For vertical processing apparatuses, it is also required to improve semiconductor processing methods in accordance with the demands described above. For example, there is a CVD (Chemical Vapor Deposition) method for a film formation process, which performs film formation while intermittently supplying a source gas and so forth to repeatedly form layers each having an atomic or molecular level thickness, one by one, or several by several (for example, Jpn. Pat. Appln. KOKAI Publications No. 6-45256 and No. 11-87341). In general, this film formation method is called ALD (Atomic layer Deposition), which allows a predetermined process to be performed without exposing wafers to a very high temperature.

Further, WO 2004/066377 (Dec. 15, 2004), which corresponds to U.S. Pat. No. 7,094,708 B2, discloses a structure of a vertical processing apparatus for performing ALD, which utilizes plasma assistance to further decrease the process temperature. According to this apparatus, for example, where dichlorosilane (DCS) and $NH_3$ are used as a silane family gas and a nitriding gas, respectively, to form a silicon nitride film (SiN), the process is performed, as follows. Specifically, DCS and $NH_3$ gas are alternately and intermittently supplied into a process container with purge periods interposed therebetween. When $NH_3$ gas is supplied, an RF (radio frequency) is applied to generate plasma so as to promote a nitridation reaction. More specifically, when DCS is supplied into the process container, a layer with a thickness of one molecule or more of DCS is adsorbed onto the surface of wafers. The superfluous DCS is removed during the purge period. Then, $NH_3$ is supplied and plasma is generated, thereby performing low temperature nitridation to form a silicon nitride film. These sequential steps are repeated to complete a film having a predetermined thickness.

BRIEF SUMMARY OF THE INVENTION

An object of the present invention is to provide a vertical plasma processing apparatus for a semiconductor process, which can improve the generation efficiency of plasma without adversely affecting the process field.

According to a first aspect of the present invention, there is provided a vertical plasma processing apparatus for a semiconductor process, the apparatus comprising:

a process container having a process field configured to accommodate a plurality of target substrates at intervals in a vertical direction; a support member configured to support the target substrates inside the process field;

an exhaust system configured to exhaust gas from the process field;

an airtight auxiliary chamber defined by a casing having an insulative inner surface and integrated with the process container, the auxiliary chamber including a plasma generation area extending over a length corresponding to the plurality of target substrates in a vertical direction;

an electric field generation mechanism provided to the process container and configured to generate an RF electric field at the plasma generation area;

a partition plate located between the process field and the plasma generation area and having an insulative surface, the partition plate including a gas passage disposed over a length corresponding to the plurality of target substrates in a vertical direction; and a process gas supply system configured to supply a process gas into the auxiliary chamber, such that the process gas is exited while passing through the plasma generation area, and is then supplied through the gas passage to the process field.

According to a second aspect of the present invention, there is provided a vertical plasma film formation apparatus for a semiconductor process, the apparatus comprising:

a process container having a process field configured to accommodate a plurality of target substrates at intervals in a vertical direction;

a support member configured to support the target substrates inside the process field; a heater configured to heat the target substrates inside the process field;

an exhaust system configured to exhaust gas from the process field;

an airtight auxiliary chamber defined by a casing having an insulative inner surface and integrated with the process container, the auxiliary chamber including a plasma generation area extending over a length corresponding to the plurality of target substrates in a vertical direction;

an electric field generation mechanism provided to the process container and configured to generate an RF electric field at the plasma generation area;

a partition plate located between the process field and the plasma generation area and having an insulative surface, the partition plate including a gas passage disposed over a length corresponding to the plurality of target substrates in a vertical direction;

a process gas supply system configured to selectively supply into the process field a first process gas that provides a main material of a thin film and a second process gas that reacts with the first process gas, so as to deposit the thin film on the target substrates, such that at least one of the first and second process gases is supplied into the auxiliary chamber to be exited while passing through the plasma generation area, and is then supplied through the gas passage to the process field; and a control section configured to control an operation of the apparatus, wherein, in order to deposit the thin film on the target substrates, the control section executes supply of the first process gas to the process field and supply of the second process gas to the process field, repeatedly a plurality of times.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 is a sectional view showing a vertical plasma processing apparatus (vertical plasma film formation apparatus) according to a first embodiment of the present invention;

FIG. 2 is a sectional plan view showing part of the apparatus shown in FIG. 1;

FIG. 3 is a view showing a partition plate used in the apparatus shown in FIG. 1;

FIG. 7 is a graph showing the relationship between the flow rate of $NH_3$ gas supplied from a gas distribution nozzle of a second process gas and the pressure of each area, obtained by an experiment;

FIG. 8 is a graph showing the relationship between the pressure of a plasma generation area and plasma density, obtained by an experiment;

FIG. 11 is a graph showing the relationship between the flow rate of $NH_3$ gas supplied from the gas distribution nozzle of a second process gas and the pressure of each area, obtained by an experiment;

FIG. 12 is a graph showing the relationship between the voltage of an RF power supply and plasma density, obtained by an experiment;

DETAILED DESCRIPTION OF THE INVENTION

Figure 4:
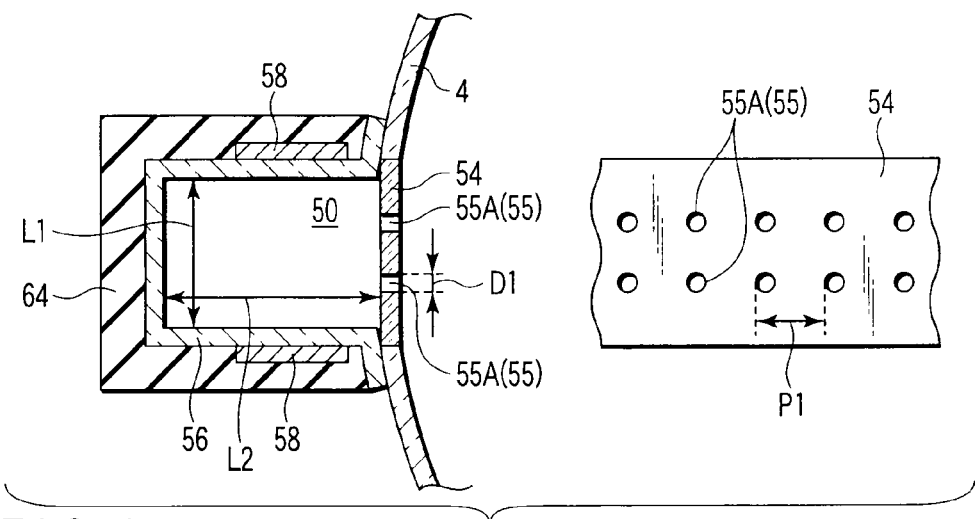
FIG. 4 is a view showing the relationship between a gas exciting section and a partition plate usable in the apparatus shown in FIG. 1.

In the process of developing the present invention, the inventors studied problems caused in vertical plasma processing apparatuses, as those disclosed in WO 2004/066377 and so forth. As a result, the inventors have arrived at the findings given below.

In the case of the plasma processing apparatus disclosed in WO 2004/066377, the gas flow conductance between the process field (process area) for accommodating wafers and the plasma generation area are very large, so these areas have almost the same pressure. The pressure of the process field is set at a low value to improve the inter-substrate uniformity and planar uniformity in the thickness of a film deposited on the wafers. Accordingly, in this plasma processing apparatus, the pressure of the plasma generation area becomes low in accordance with the pressure of the process field. However, the plasma generation efficiency depends on the pressure of the plasma generation area, such that the generation efficiency is deteriorated if the pressure is too low. Further, where the pressure of the plasma generation area is low, the wall surface made of, e.g., quartz and defining the plasma generation area is sputtered and damaged by plasma ions accelerated by an electric field.

The pressure of the plasma generation area (the pressure inside the plasma chamber) can be increased with an increase in the flow rate of $NH_3$ gas, i.e., plasma gas. However, in the plasma processing apparatus described above, with an increase in the flow rate of $NH_3$ gas, the pressure of the process field is also increased. Consequently, the inter-substrate uniformity and planar uniformity in the thickness of a film deposited on the wafers may be deteriorated. Further, an increase in the flow rate of $NH_3$ gas entails a larger wastage of gas, thereby greatly increasing the running cost.

Embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary.

FIRST EMBODIMENT

FIG. 1 is a sectional view showing a vertical plasma processing apparatus (vertical plasma film formation apparatus)

according to a first embodiment of the present invention. FIG. 2 is a sectional plan view showing part of the apparatus shown in FIG. 1. The film formation apparatus 2 has a process field configured to be selectively supplied with a first process gas containing dichlorosilane (DCS) gas as a silane family gas, a second process gas containing ammonia ($NH_3$) gas as a nitriding gas, and a purge gas comprising an inactive gas, such as $N_2$ gas. The film formation apparatus 2 is configured to form a silicon nitride film on target substrates by CVD in the process field.

The apparatus 2 includes a process container 4 shaped as a cylindrical column with a ceiling and an opened bottom, in which a process field 5 is defined to accommodate and process a plurality of semiconductor wafers (target substrates) stacked at intervals. The entirety of the process container 4 is made of, e.g., quartz. The top of the process container 4 is provided with a quartz ceiling plate 6 to airtightly seal the top. The bottom of the process container 4 is connected through a seal member 10, such as an O-ring, to a cylindrical manifold 8. The process container may be entirely formed of a cylindrical quartz column without a manifold 8 separately formed.

The cylindrical manifold 8 is made of, e.g., stainless steel, and supports the bottom of the process container 4. A wafer boat 12 made of quartz is moved up and down through the bottom port of the manifold 8, so that the wafer boat 12 is loaded/unloaded into and from the process container 4. A number of target substrates or semiconductor wafers W are stacked on a wafer boat 12. For example, in this embodiment, the wafer boat 12 has struts 12A that can support, e.g., about 50 to 100 wafers having a diameter of 300 mm at essentially regular intervals in the vertical direction.

The wafer boat 12 is placed on a table 16 through a heat-insulating cylinder 14 made of quartz. The table 16 is supported by a rotary shaft 20, which penetrates a lid 18 made of, e.g., stainless steel, and is used for opening/closing the bottom port of the manifold 8.

The portion of the lid 18 where the rotary shaft 20 penetrates is provided with, e.g., a magnetic-fluid seal 22, so that the rotary shaft 20 is rotatably supported in an airtightly sealed state. A seal member 24, such as an O-ring, is interposed between the periphery of the lid 18 and the bottom of the manifold 8, so that the interior of the process container 4 can be kept sealed.

The rotary shaft 20 is attached at the distal end of an arm 26 supported by an elevating mechanism 25, such as a boat elevator. The elevating mechanism 25 moves the wafer boat 12 and lid 18 up and down in unison. The table 16 may be fixed to the lid 18, so that wafers W are processed without rotation of the wafer boat 12.

A gas supply section is connected to the side of the manifold 8 to supply predetermined process gases to the process field 5 within the process container 4. Specifically, the gas supply section includes a second process gas supply circuit 28, a first process gas supply circuit 30, and a purge gas supply circuit 32. The first process gas supply circuit 30 is arranged to supply a first process gas containing a silane family gas, such as DCS (dichlorosilane) gas. The second process gas supply circuit 28 is arranged to supply a second process gas containing a nitriding gas, such as ammonia ($NH_3$) gas. The purge gas supply circuit 32 is arranged to supply an inactive gas, such as $N_2$ gas, as a purge gas. Each of the first and second process gases may be mixed with a suitable amount of carrier gas, as needed. However, such a carrier gas will not be mentioned, hereinafter, for the sake of simplicity of explanation.

More specifically, the second process gas supply circuit 28, first process gas supply circuit 30, and purge gas supply circuit 32 include gas distribution nozzles 34, 36, and 38, respectively, each of which is formed of a quartz pipe which penetrates the sidewall of the manifold 8 from the outside and then turns and extends upward (see FIG. 2). The gas distribution nozzles 34, 36, and 38 respectively have a plurality of gas spouting holes 34A, 36A, and 38A, each set being formed at predetermined intervals in the longitudinal direction (the vertical direction) over all the wafers W on the wafer boat 12.

The nozzles 34, 36, and 38 are connected to gas sources 28S, 30S, and 32S of $NH_3$ gas, DCS gas, and $N_2$ gas, respectively, through gas supply lines (gas passages) 42, 44, and 46, respectively. The gas supply lines 42, 44, and 46 are provided with switching valves 42A, 44A, and 46A and flow rate controllers 42B, 44B, and 46B, such as mass flow controllers, respectively. With this arrangement, $NH_3$ gas, DCS gas, and $N_2$ gas can be supplied at controlled flow rates.

A gas exciting section 50 is formed at the sidewall of the process container 4 in the vertical direction. On the side of the process container 4 opposite to the gas exciting section 50, a long and thin exhaust port 52 for vacuum-exhausting the inner atmosphere is formed by cutting the sidewall of the process container 4 in, e.g., the vertical direction.

Specifically, the gas exciting section 50 has a vertically long and thin opening formed by cutting a predetermined width of the sidewall of the process container 4, in the vertical direction. The opening is closed by a partition plate 54 having a gas passage 55 and is covered with a quartz cover 56 airtightly connected to the outer surface of the process container 4. The cover 56 has a vertically long and thin shape with a concave cross-section, so that it projects outward from the process container 4.

With this arrangement, the gas exciting section 50 is formed such that it projects outward from the sidewall of the process container 4 and is connected on the other side to the interior of the process container 4. In other words, the inner space of the gas exciting section 50 communicates through the gas passage 55 of the partition plate 54 with the process field 5 within the process container 4. The partition plate 54 has a vertical length sufficient to cover all the wafers W on the wafer boat 12 in the vertical direction.

A pair of long and thin electrodes 58 are disposed on the opposite outer surfaces of the cover 56, and face each other while extending in the longitudinal direction (the vertical direction). The electrodes 58 are connected to an RF (Radio Frequency) power supply 60 for plasma generation, through feed lines 62. An RF voltage of, e.g., 13.56 MHz is applied to the electrodes 58 to form an RF electric field for exciting plasma between the electrodes 58. The frequency of the RF voltage is not limited to 13.56 MHz, and it may be set at another frequency, e.g., 400 kHz.

The gas distribution nozzle 34 of the second process gas is bent outward in the radial direction of the process container 4 and penetrates the partition plate 54, at a position lower than the lowermost wafer W on the wafer boat 12. Then, the gas distribution nozzle 34 vertically extends at the deepest position (the farthest position from the center of the process container 4) in the gas exciting section 50. As also shown in FIG. 2, the gas distribution nozzle 34 is separated outward from an area sandwiched between the pair of electrodes 58 (a position where the RF electric field is most intense), i.e., a plasma generation area PS where the main plasma is actually generated. The second process gas containing $NH_3$ gas is spouted from the gas spouting holes 34A of the gas distribution nozzle 34 toward the plasma generation area PS. Then, the second process gas is excited (decomposed or activated) in the plasma generation area PS, and is supplied in this state through the gas passage 55 of the partition plate 54 onto the wafers W on the wafer boat 12.

An insulating protection cover 64 made of, e.g., quartz is attached to and covers the outer surface of the cover 56. A cooling mechanism (not shown) is disposed in the insulating protection cover 64 and comprises coolant passages respectively facing the electrodes 58. The coolant passages are supplied with a coolant, such as cooled nitrogen gas, to cool the electrodes 58. The insulating protection cover 64 is covered with a shield (not shown) disposed on the outer surface to prevent RF leakage.

The gas distribution nozzles 36 and 38 of the first process gas and purge gas extend upward and face each other at positions near and outside the partition plate 54 of the gas exciting section 50, i.e., on both sides of the outside of the partition plate 54 (in the process container 4). The first process gas containing DCS gas and the purge gas consisting of $N_2$ gas are spouted from the gas spouting holes 36A and 38A of the gas distribution nozzles 36 and 38, respectively, toward the center of the process container 4. The gas spouting holes 36A and 38A are formed at positions between the wafers W on the wafer boat 12 to respectively deliver the first process gas (containing DCS) and purge gas ($N_2$ gas) essentially uniformly in the horizontal direction, so as to form gas flows parallel with the wafers W.

On the other hand, the exhaust port 52, which is formed opposite the gas exciting section 50, is covered with an exhaust port cover member 66. The exhaust port cover member 66 is made of quartz with a U-shape cross-section, and attached by welding. The exhaust port cover member 66 extends upward along the sidewall of the process container 4, and has a gas outlet 68 at the top of the process container 4. The gas outlet 68 is connected to a vacuum-exhaust system GE including a vacuum pump and so forth. The vacuum exhaust system GE has an exhaust passage 84 connected to the gas outlet 68, on which a valve unit (an opening degree adjustment valve) 86, a vacuum pump 88, and a detoxification unit 89 for removing undesirable substances are disposed in this order from the upstream side.

The process container 4 is surrounded by a heater 70, which is used for heating the atmosphere within the process container 4 and the wafers W. A thermocouple (not shown) is disposed near the exhaust port 52 in the process container 4 to control the heater 70.

The film formation apparatus 2 further includes a main control section 48 formed of, e.g., a computer, to control the entire apparatus. The main control section 48 can control the film formation process described below in accordance with the process recipe of the film formation process concerning, e.g., the film thickness and composition of a film to be formed, stored in the memory thereof in advance. In the memory, the relationship between the process gas flow rates and the thickness and composition of the film is also stored as control data in advance. Accordingly, the main control section 48 can control the elevating mechanism 25, gas supply circuits 28, 30, and 32, exhaust system GE (including the valve unit 86), gas exciting section 50, heater 70, and so forth, based on the stored process recipe and control data.

FIG. 3 is a view showing the partition plate 54. FIG. 4 is a view showing the relationship between the gas exciting section 50 and partition plate 54. In FIG. 4, the gas exciting section 50 is shown by a sectional plan view and the partition plate 54 is shown by a front view. In this embodiment, the process container 4, the partition plate 54, and the cover 56 of the gas exciting section 50 are made of the same insulative material (specifically, quartz), and are connected to each other by welding. The partition plate 54 is fixed to the wall defining the opening formed in the process container 4 while the cover 56 is fixed to the outer surface of the process container 4.

The partition plate 54 has a gas passage 55 formed therein for the plasma generation area SP to communicate with the process field 5. As shown in FIGS. 3 and 4, the gas passage 55 consists of a number of gas diffusion holes 55A having a circular shape. The gas diffusion holes 55A are arrayed in two vertical rows at predetermined intervals in the longitudinal direction (the vertical direction) of the partition plate 54 over all the wafers W on the wafer boat 12. The gas diffusion holes 55A are formed at positions between the wafers W on the wafer boat 12, at the same regular intervals P1 as the intervals of the wafers W. The gas diffusion holes 55A allow the second process gas (containing $NH_3$) activated by plasma to pass therethrough essentially uniformly in the horizontal direction, so as to form gas flows parallel with the wafers W.

The partition plate 54 decreases the gas flow conductance between the plasma generation area SP and process field 5. Consequently, the pressure of the plasma generation area SP can be increased without adversely affecting the process field 5 in terms of pressure. For this purpose, the opening ratio of the gas passage 55 is set to be 7.3% or less, and preferably 2.0% or less. This opening ratio is defined by the ratio of the total area of the gas passage 55 relative to the area of the face of the gas exciting section (auxiliary chamber) 50 opposite the process container 4 (which is essentially the same as that of the partition plate 54).

More specifically, the gas exciting section (auxiliary chamber) 50 has a width L1 of about 25 to 35 mm, a depth L2 of about 45 to 60 mm, and a length of about 500 to 1,000 mm in the vertical direction. Each of the gas diffusion holes 55A has a diameter D1 of, e.g., 5 mm or less, preferably of about 1 mm, depending on the number of holes. It is undesirable to set the diameter D1 to be smaller than 1 mm, because hollow-cathode discharge can easily occur due to electric field concentration.

Where the pressure of the plasma generation area SP is set higher, the plasma generation efficiency can be improved. Further, where the pressure of the plasma generation area SP is set higher, the mean free path of molecules becomes shorter accordingly. Consequently, the wall surface defining the gas exciting section 50 is less sputtered by plasma ions.

Furthermore, the partition plate 54 can decrease the number of charged particles, such as ions, that enter the process field 5 from the plasma generation area SP. Consequently, radicals are preferentially caused to act on the wafers W to form a film. In light of this, the gas spouting holes 34A are formed in the gas distribution nozzle 34 of the second process gas at positions between the gas diffusion holes 55A of the partition plate 54 in the vertical direction. At positions shifted from the gas diffusion holes 55A in the vertical direction, the gas spouting holes 34A deliver the second process gas (containing $NH_3$) essentially uniformly in the horizontal direction toward the partition plate 54.

Figure 5:
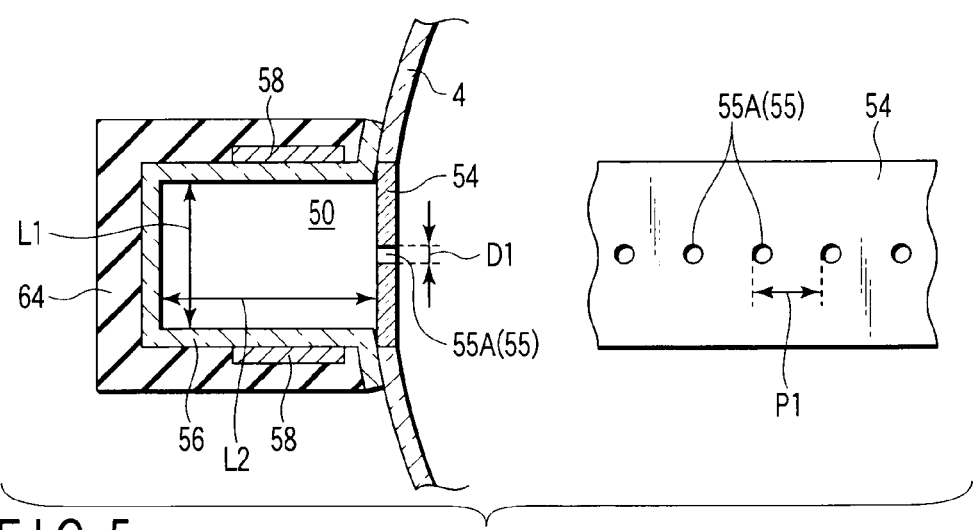
FIG. 5 is a view showing the relationship between a gas exciting section and a partition plate usable in the apparatus shown in FIG. 1, according to a modification.
Figure 6:
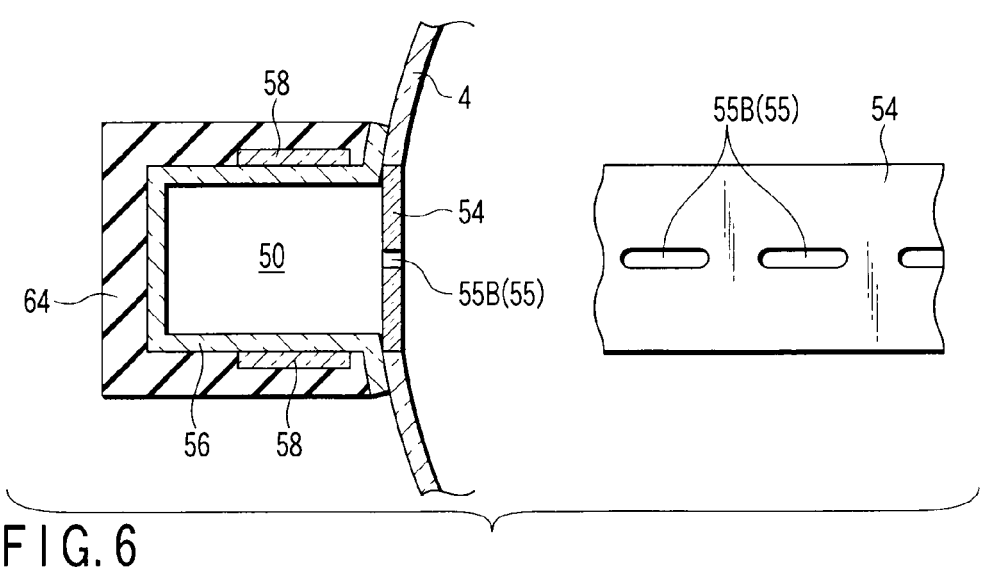
FIG. 6 is a view showing the relationship between a gas exciting section and a partition plate usable in the apparatus shown in FIG. 1, according to an alternative modification.

FIG. 5 is a view showing the relationship between the gas exciting section 50 and a partition plate 54 according to a modification. FIG. 6 is a view showing the relationship between the gas exciting section 50 and a partition plate 54 according to an alternative modification. In each of FIGS. 5 and 6, the gas exciting section 50 is shown by a sectional plan view and the partition plate 54 is shown by a front view. In the modification shown in FIG. 5, the gas passage 55 consists of gas diffusion holes 55A arrayed in one vertical row at predetermined intervals in the longitudinal direction (the vertical direction) of the partition plate 54 over all the wafers W on the wafer boat 12. In the modification shown in FIG. 6, the gas passage 55 consists of vertically long and thin slits 55B arrayed in one vertical row at predetermined intervals in the longitudinal direction (the vertical direction) of the partition plate 54 over all the wafers W on the wafer boat 12.

Next, an explanation will be given of a film formation method (so called ALD (Atomic Layer Deposition) film formation) performed in the apparatus shown in FIG. 1. In summary, this film formation method is arranged to selectively supply a first process gas containing dichlorosilane (DCS) gas as a silane family gas and a second process gas containing ammonia ($NH_3$) gas as a nitriding gas to the process field 5 accommodating wafers W to form a silicon nitride film on the wafers W by CVD.

At first, the wafer boat 12 at room temperature, which supports a number of, e.g., 50 to 100, wafers having a diameter of 300 mm, is loaded into the process container 4 heated at a predetermined temperature. Then, the interior of the process container 4 is vacuum-exhausted and kept at a predetermined process pressure, and the wafer temperature is increased to a process temperature for film formation. At this time, the apparatus is in a waiting state until the temperature becomes stable. Then, the first process gas containing DCS gas, the second process gas containing $NH_3$ gas, and the purge gas consisting of $N_2$ gas are intermittently supplied from the respective gas distribution nozzles 36, 34, and 38 at controlled flow rates.

Specifically, the first process gas containing DCS gas is supplied from the gas spouting holes 36A of the gas distribution nozzle 36 to form gas flows parallel with the wafers W on the wafer boat 12. While being supplied, molecules of DCS gas and molecules and atoms of decomposition products generated by its decomposition are adsorbed on the wafers W.

On the other hand, the second process gas containing $NH_3$ gas is supplied from the gas spouting holes 34A of the gas distribution nozzle 34 to form horizontal gas flows toward the partition plate 54. The second process gas is selectively excited and partly turned into plasma when it passes through the plasma generation area PS between the pair of electrodes 58. At this time, for example, radicals (activated species), such as $N^*$, $NH^*$, $NH_2^*$, and $NH_3^*$, are produced (the symbol [*] denotes that it is a radical). The radicals flow out from the gas passage 55 of the partition plate 54 of the gas exciting section 50 toward the center of the process container 4, and are supplied into gaps between the wafers W in a laminar flow state.

The radicals react with molecules of DCS gas adsorbed on the surface of the wafers W, so that a silicon nitride film is formed on the wafers W. Alternatively, when DCS gas flows onto radicals adsorbed on the surface of the wafers W, the same reaction is caused, so a silicon nitride film is formed on the wafers W.

Immediately after the step of supplying the first process gas containing DCS gas, and immediately after the step of supplying the second process gas containing $NH_3$ gas, the purge gas consisting of $N_2$ gas is supplied into the process field 5. The purge gas is supplied from the gas spouting holes 38A of the gas distribution nozzle 38 to form gas flows parallel with the wafers W on the wafer boat 12. The purge gas flows thus formed serve to forcibly remove residual components within the process field 5, such as DCS gas and its decomposition products or $NH_3$ gas and its decomposition products.

Specifically, the film formation method according to this embodiment is arranged to alternately repeat first to fourth steps T1 to T4. A cycle comprising the first to fourth steps T1 to T4 is repeated a number of times, and thin films of silicon nitride formed by respective cycles are laminated, thereby arriving at a silicon nitride film having a target thickness.

The first step T1 is arranged to perform supply of the first process gas (containing DCS) to the process field 5, while stopping supply of the second process gas (containing $NH_3$) and the purge gas ($N_2$) to the process field 5. The second step T2 is arranged to perform supply of the purge gas to the process field 5, while stopping supply of the first and second process gases to the process field 5. The third step T3 is arranged to perform supply of the second process gas to the process field 5, while stopping supply of the first process gas and purge gas to the process field 5. Further, halfway through the third step T3, the RF power supply 60 is set in the ON state to turn the second process gas into plasma by the gas exciting section 50, so as to supply the second process gas in an activated state to the process field 5 during a sub-step T3b. The fourth step T4 is arranged to perform supply of the purge gas to the process field 5, while stopping supply of the first and second process gases to the process field 5. Over the entirety of the first step T1 to the fourth step T4, the process field 5 is continuously vacuum-exhausted by the vacuum exhaust system GE through the exhaust passage 84.

The first step T1 is set to be within a range of about 1 to 120 seconds, e.g., at about 5 seconds. The second step T2 is set to be within a range of about 1 to 30 seconds, e.g., at about 5 seconds. The third step T3 is set to be within a range of about 1 to 120 seconds, e.g., at about 10 seconds. The sub-step T3b is set to be within a range of about 1 to 120 seconds, e.g., at about 8 seconds. The fourth step T4 is set to be within a range of about 1 to 30 seconds, e.g., at about 5 seconds. In general, the film thickness obtained by one cycle of the first to fourth steps T1 to T4 is about 0.05 to 0.11 nm. Accordingly, for example, where the target film thickness is 70 nm, the cycle is repeated about 600 times. However, these values of time and thickness are mere examples and thus are not limiting.

The flow rate of DCS gas is set to be within a range of 50 to 2,000 sccm, e.g., at 1,000 sccm (1 slm: standard liter per minute). The flow rate of $NH_3$ gas is set to be within a range of 100 to 5,000 sccm, e.g., at 3,000 sccm. The flow rate of $N_2$ gas is set to be within a range of 300 to 5,000 sccm, e.g., at 3,000 sccm. The process temperature is lower than that for ordinary CVD processes, and is set to be within a range of 250 to 700° C., and preferably of 350 to 600° C. If the process temperature is lower than 250° C., essentially no film is deposited because hardly any reaction is caused. If the process temperature is higher than 700° C., a low quality CVD film is deposited, and existing films, such as a metal film, may suffer thermal damage.

The process pressure (the pressure of the process field 5) is set to be within a range of 0.2 to 1 Torr (27 to 133 Pa (1 Torr=133.3 Pa)). This condition can improve the inter-substrate uniformity and planar uniformity in the thickness of a film formed by the plasma film formation. If the process pressure is higher than 1.0 Torr, radicals are deactivated drastically. If the process pressure is lower than 0.2 Torr, the film formation rate becomes lower than the practical level.

On the other hand, the pressure of the plasma generation area SP (the pressure inside the gas exciting section (auxiliary chamber) 50) is set to be within a range of, e.g., 0.7 to 5.0 Torr (93 to 667 Pa). If the pressure of the plasma generation area SP is set higher, the plasma generation efficiency can be improved, so the plasma density becomes higher. If the pressure of the plasma generation area SP is higher than 5.0 Torr, the plasma ignition becomes very difficult. If this pressure is lower than 0.7 Torr, the plasma generation efficiency is deteriorated drastically.

The partition plate 54 decreases the gas flow conductance between the plasma generation area SP and process field 5. Consequently, the pressure of the plasma generation area SP can be increased without adversely affecting the process field 5 in terms of pressure. In other words, the plasma generation area SP can be set at a pressure suitable for increasing the plasma generation efficiency, while the process field 5 can be set at a pressure suitable for improving the throughput and the inter-substrate uniformity and planar uniformity of the process.

<Pressures of Plasma Generation Area and Process Field>

Using the apparatus shown in FIG. 1, an experiment was conducted to examine the relationship between the pressures of the plasma generation area SP and process field 5. In this experiment, as shown in FIG. 3, the gas passage 55 of the partition plate 54 was formed of gas diffusion holes 55A arrayed in two vertical rows at predetermined intervals over all wafers W. The diameter D1 of the diffusion holes 55A was set at 0.7 mm, and the opening ratio of the diffusion holes 55A relative to the partition plate 54 was set at 0.4%. The interior of the process container 4 was vacuum-exhausted at an exhaust rate of 120 liters/second at the maximum.

FIG. 7 is a graph showing the relationship between the flow rate of $NH_3$ gas supplied from the gas distribution nozzle 34 of the second process gas and the pressure of each area, obtained by this experiment. In FIG. 7, the horizontal axis denotes the flow rate of $NH_3$ gas (slm), and the vertical axis denotes the pressure (Torr). Further, a characteristic line A indicates the pressure of the process field 5, and a characteristic line B indicates the pressure of the plasma generation area SP. As shown in FIG. 7, the pressure of the plasma generation area SP became sufficiently higher than the pressure of the process field 5. Further, with an increase in the gas flow rate, the pressure difference between two areas also increased. On the other hand, where no partition plate 54 was used (the conventional apparatus), the pressures of the plasma generation area SP and process field 5 were almost the same, and were changed as shown in the characteristic line A.

<Plasma Generation Efficiency>

Using the apparatus shown in FIG. 1, an experiment was conducted to examine the relationship between the pressure of the plasma generation area SP and the plasma density. In this experiment, the heater 70 was set at a heating temperature of 450° C. The RF power supply 60 for plasma generation was set at three different values, 150, 200, and 250 watts. As a reference, it was assumed that, where no partition plate 54 was used (the conventional apparatus), the pressure of the plasma generation area was 0.6 Torr, which was the same as that of the process field. The plasma density was calculated by plasma pressure conversion.

FIG. 8 is a graph showing the relationship between the pressure of the plasma generation area and the plasma density, obtained by this experiment. In FIG. 8, the horizontal axis denotes the pressure of the plasma generation area SP (Torr), and the vertical axis denotes the plasma density ($cm^{-3}$: Torr conversion). Further, a characteristic line C1 indicates the case of 150 watts, a characteristic line C2 indicates the case of 200 watts, and a characteristic line C3 indicates the case of 250 watts. As shown in FIG. 8, the peak value of each of the characteristic lines C1, C2, and C3 was far higher than the value obtained in the case of no partition plate 54 being used (the conventional apparatus: Ref.=0.6 Torr). Particularly, in the case of the characteristic line C3, the plasma density was about two times the value obtained by the case of no partition plate 54 being used. Accordingly, it has been confirmed that the plasma generation efficiency can be improved by use of the partition plate 54.

Further, in the case of the characteristic lines C1 and C2, the plasma density reached its peak value when the pressure of the plasma generation area was at about 0.9 Torr. In this case, the plasma density was rapidly decreased with a decrease in the pressure with its value lower than 0.9 Torr, and was gradually decreased with an increase in the pressure with its value higher than 0.9 Torr. In the case of the characteristic line C3, the plasma density reached its peak value when the pressure of the plasma generation area was at about 1.1 Torr. In this case, the plasma density was decreased more rapidly than the characteristic lines C1 and C2, with a decrease in the pressure with its value lower than 1.1 Torr, and was decreased more gradually than the characteristic lines C1 and C2, with an increase in the pressure with its value higher than 1.1 Torr.

Where the lower limit of the plasma density was set at 80% of the peak value, the range of the pressure of the plasma generation area were as follows. Specifically, in the case of the characteristic line C1 indicating the case with a power of 150 watts, the pressure was preferably within a range of 0.7 to 2.0 Torr, and more preferably of 0.8 to 1.4 Torr. In the case of the characteristic line C2 indicating the case with a power of 200 watts, the pressure was preferably within a range of 0.7 to 2.2 Torr, and more preferably of 0.8 to 1.5 Torr. In the case of the characteristic line C3 indicating the case with a power of 250 watts, the pressure was preferably within a range of 0.7 to 4 Torr, and more preferably of 0.8 to 2.5 Torr. Where the pressure was higher than 5.0 Torr, the plasma ignition became very difficult.

From the result described above, it has been found that the plasma density, i.e., plasma generation efficiency reaches its peak at about 1 Torr and varies depending on the application RF power. Further, it has been found that, where the pressure of the plasma generation area SP is set to be within a range of 0.7 to 5.0 Torr, the plasma generation efficiency can be maintained at a high level.

<Opening Ratio of Partition Plate 54>

Using the apparatus shown in FIG. 1, an experiment was conducted to examine the relationship of the opening ratio of the partition plate 54 relative to the pressure difference between the plasma generation area SP and process field 5. This opening ratio is defined by the ratio of the total area of the gas passage 55 relative to the area of the partition plate. In this experiment, the gas passage 55 formed in the partition plate 54 was changed in various sizes to set different opening ratios. Then, a gas was supplied from the gas distribution nozzle 34 toward each partition plate 54 with an opening ratio thus set, and the pressure difference between the plasma generation area SP and process field 5 was measured.

As a result, where the opening ratio was within a range of 100% (no partition plate) to about 7.3%, a pressure difference was hardly generated. However, where the opening ratio was 7.3% or less, a pressure difference was gradually generated. Accordingly, it has been found that the opening ratio of the gas passage 55 (diffusion holes 55A) is preferably set to be 7.3% or less. However, the opening ratio is preferably set to be 0.3% or more, because the number of radicals (containing gas) flowing into the process field 5 becomes too small, if the opening ratio is excessively low.

SECOND EMBODIMENT

Figure 9:
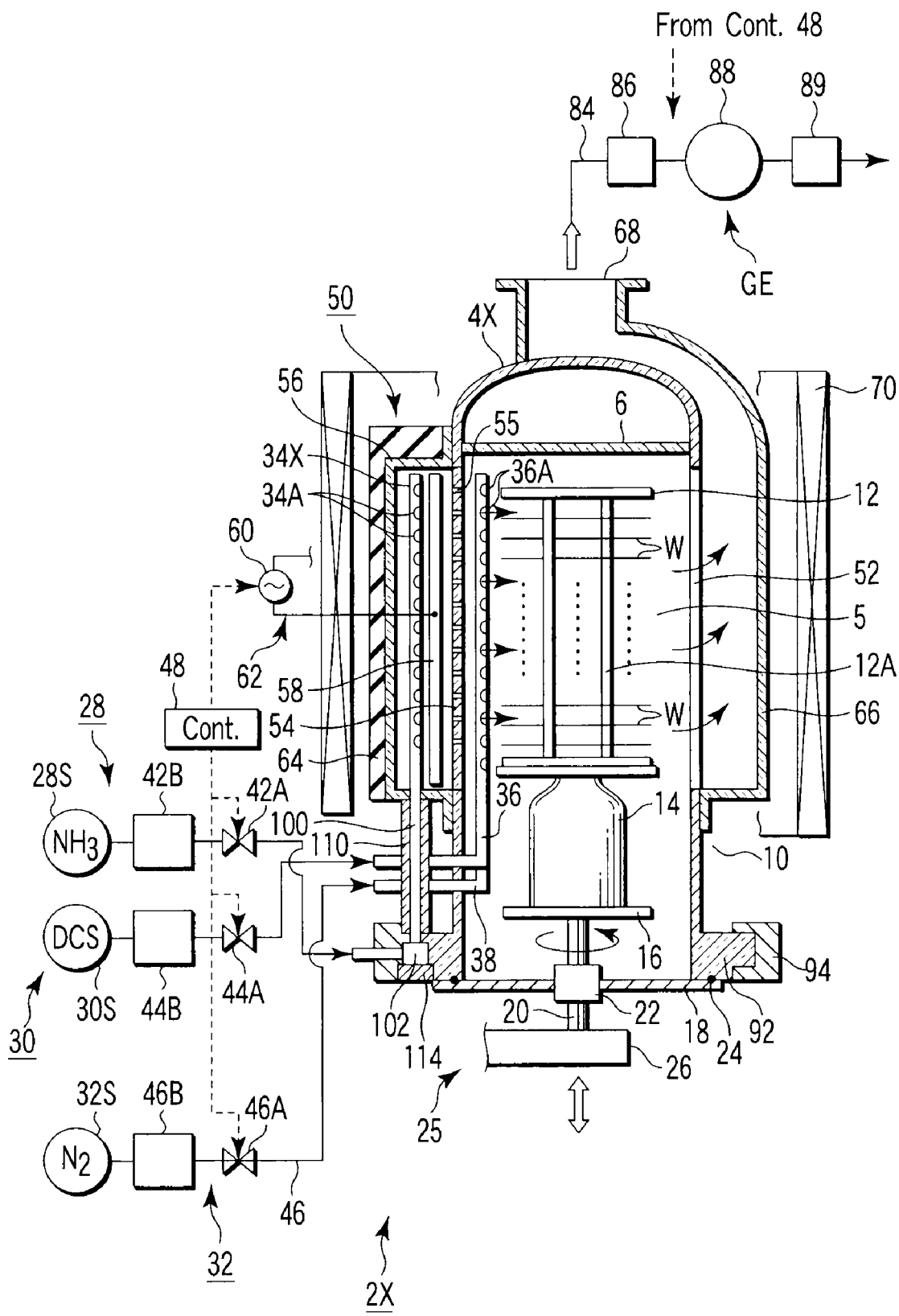
FIG. 9 is a sectional view showing a vertical plasma processing apparatus (vertical plasma film formation apparatus) according to a second embodiment of the present invention.

FIG. 9 is a sectional view showing a vertical plasma processing apparatus (vertical plasma film formation apparatus) according to a second embodiment of the present invention. The film formation apparatus 2X according to the second embodiment has the same structure as the film formation apparatus 2 according to the first embodiment except that a gas distribution nozzle 34X of the second process gas is attached in a different manner. Accordingly, an explanation focusing on the different points will be given of the film formation apparatus 2X according to the second embodiment.

The film formation apparatus 2X includes a process container 4X that is not provided with the stainless steel manifold 8 shown in FIG. 1, but is entirely formed of a cylindrical quartz container. The process container 4X has a flange 92 integrally formed therewith around the bottom port, wherein the flange 92 is formed of a thick ring extending outward in the radial direction. A reinforcing member 94 made of a stainless steel ring is fitted on the periphery of the flange 92. The gas distribution nozzle 34X of the second process gas is attached by use of this flange 92. The gas distribution nozzle 34X has a plurality of gas spouting holes 34A in the same design as in the film formation apparatus 2 according to the first embodiment.

Figure 10:
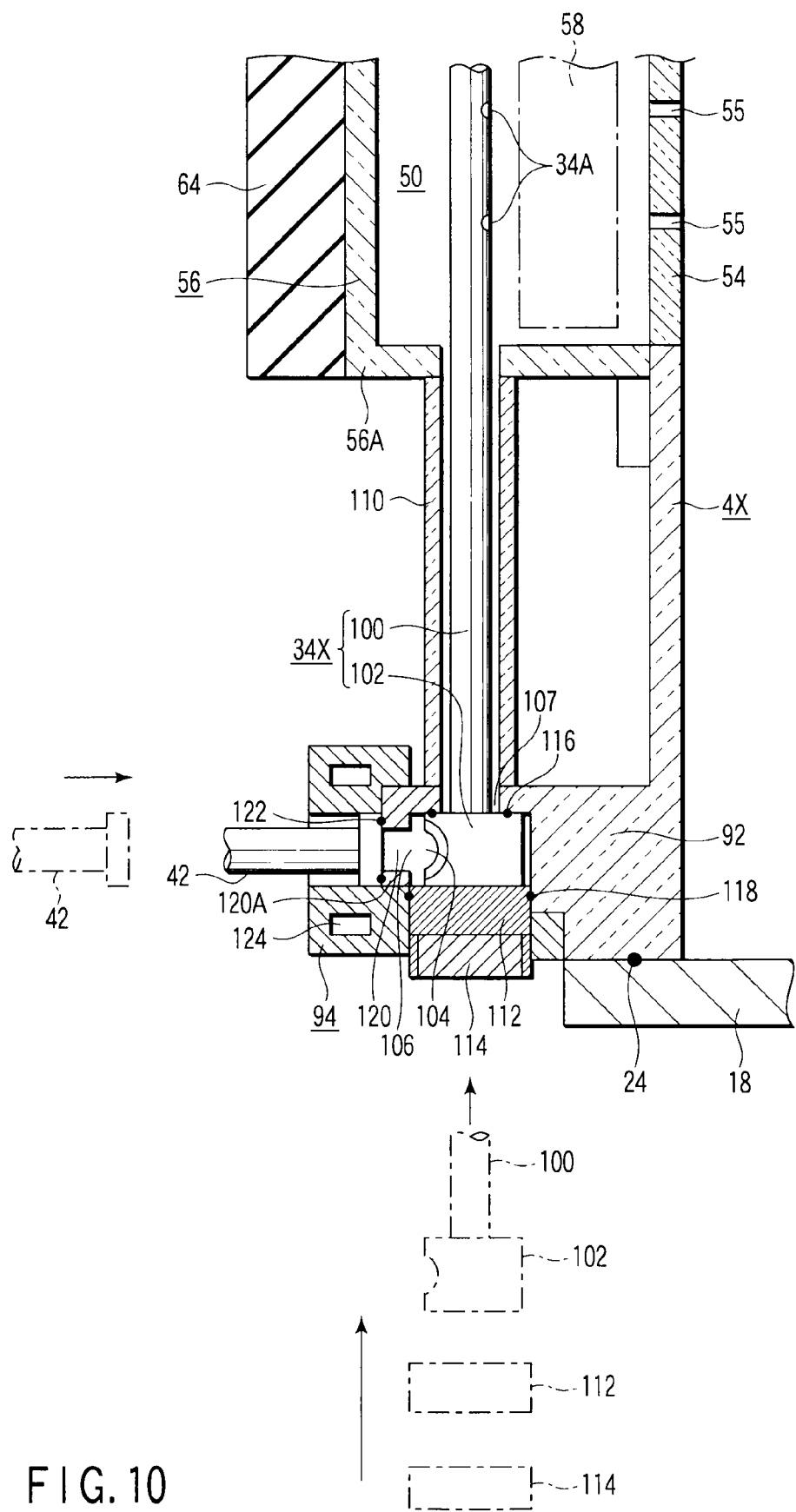
FIG. 10 is a view showing an attaching structure of a gas distribution nozzle of a second process gas relative to the flange of a process container in the apparatus shown in FIG. 9.

FIG. 10 is a view showing an attaching structure of the gas distribution nozzle of the second process gas relative to the flange of the process container. As shown in FIG. 10, the gas distribution nozzle 34X includes a nozzle main body 100 formed of a straight quartz pipe, and a gas head 102 formed of a quartz container and connected to the bottom end of the nozzle main body 100. The gas head 102 has an opening 104 formed in one side. The flange 92 of the process container 4X has an insertion recess 106 formed in the bottom and aligned with a through hole formed in the reinforcing member 94.

An opening 107 is formed at the center of the ceiling of the insertion recess 106, while an opening 108 is formed in the bottom 56A of the cover 56 defining the gas exciting section 50, so that the openings 107 and 108 are positionally aligned with each other. An auxiliary insertion pipe 110 is connected and fixed to the openings 107 and 108 in a vertical state, so that the openings 107 and 108 communicate with each other. In this embodiment, the process container 4X, the cover 56 of the gas exciting section 50, and the auxiliary insertion pipe 110 are made of the same insulative material (specifically, quartz), and are connected to each other by welding.

The auxiliary insertion pipe 110 has an inner diameter larger than the outer diameter of the nozzle main body 100. The nozzle main body 100 is inserted into the auxiliary insertion pipe 110 from below the flange 92 and is disposed in the gas exciting section 50. The gas head 102 is fitted in the insertion recess 106, and is pressed and fixed by a screw member 114 from below through a retainer 112. For example, the retainer 112 has a resilient structure formed of a fluoropolymer (Teflon: TM) member and a stainless steel member.

Accordingly, the gas distribution nozzle 34X is detachably provided to the gas exciting section 50 from below the flange 92. Seal members 116 and 118, such as O-rings, are interposed at suitable positions on the top and bottom of the gas head 102, so that the interior of the insertion recess 106 can be kept airtight. With this arrangement, the gas distribution nozzle 34X is directly and detachably provided to the gas exciting section 50, without passing through the interior of the process container 4X.

A through hole 120 is formed in the sides of the flange 92 and reinforcing member 94 and communicates with the insertion recess 106. The through hole 120 has a step portion 120A along the way, and the distal end of the stainless steel gas line 42 of the second process gas supply circuit 28 is inserted up to the step portion 120A. A seal member 122, such as an O-ring, is disposed at the distal end of the gas line 42, so that the interior of the insertion recess 106 can be kept airtight. $NH_3$ gas is supplied from the gas line 42 through the gas head 102 into the nozzle main body 100. The reinforcing member 94 has two coolant passages 124 extending in an annular direction to circulate a coolant. The coolant passages 124 are supplied with a coolant to cool portions around the flange 92 during a heat process of the wafers.

As described above, the gas distribution nozzle 34X is directly inserted into the gas exciting section 50 from below the flange 92 without passing through the interior of the process container 4X. Accordingly, the partition plate 54 is not required to have an opening formed therein for inserting the nozzle, which causes the conductance to be larger. Consequently, the pressure of the plasma generation area SP can be increased without adversely affecting the process field 5 in terms of pressure.

<Pressures of Plasma Generation Area and Process Field>

Using the apparatus shown in FIG. 9, an experiment was conducted to examine the relationship between the pressures of the plasma generation area SP and process field 5. In this experiment, as shown in FIG. 5, the gas passage 55 of the partition plate 54 was formed of gas diffusion holes 55A arrayed in one vertical row at predetermined intervals over all wafers W. The diameter D1 of the diffusion holes 55A was set at 1 mm, and the opening ratio of the diffusion holes 55A relative to the partition plate 54 was set at 0.3%. The interior of the process container 4X was set at 25° C., and was continuously vacuum-exhausted at an exhaust rate of 30 liters/second.

FIG. 11 is a graph showing the relationship between the flow rate of $NH_3$ gas supplied from the gas distribution nozzle 34X of the second process gas and the pressure of each area, obtained by this experiment. In FIG. 11, the horizontal axis denotes the flow rate of $NH_3$ gas (slm), and the vertical axis denotes the pressure (Torr). Further, a characteristic line A indicates the pressure of the process field 5, and a characteristic line B indicates the pressure of the plasma generation area SP. As shown in FIG. 11, the pressure of the plasma generation area SP became sufficiently higher than the pressure of the process field 5. Further, with an increase in the gas flow rate, the pressure difference between two areas also increased. On the other hand, where no partition plate 54 was used (the conventional apparatus), the pressures of the plasma generation area SP and process field 5 were almost the same, and were changed as shown in the characteristic line A.

<Plasma Generation Efficiency>

Using the apparatus shown in FIG. 9, an experiment was conducted to examine the relationship between the voltage of the RF power supply 60 for plasma generation and the plasma density. In this experiment, the heater 70 was set at a heating temperature of 450° C. The pressure of the plasma generation area SP (the pressure inside the gas exciting section 50) was set at three different values, 0.58, 0.99, and 3.16 Torr. The plasma density was calculated by plasma pressure conversion.

FIG. 12 is a graph showing the relationship between the voltage of the RF power supply and the plasma density, obtained by this experiment. In FIG. 12, the horizontal axis denotes the voltage (kV) of the RF power supply 60, and the vertical axis denotes the plasma density ($cm^{-3}$: Torr conversion). Further, a characteristic line C1 indicates the case of 0.58 Torr, a characteristic line C2 indicates the case of 0.99 Torr, and a characteristic line C3 indicates the case of 3.16 Torr. As shown in FIG. 12, each of the characteristic lines C1, C2, and C3 rendered a quadratic-functional increase in the plasma density with an increase in the RF voltage. Further, the increasing rate in the plasma density was larger at a higher value of the pressure. Accordingly, it has been confirmed that the plasma density, i.e., plasma generation efficiency is increased with an increase in the pressure of the plasma generation area SP.

<Flow Rate of $NH_3$ Gas, Pressure of Plasma Generation Area, and Gas Flow Conductance>

Using the apparatus shown in FIG. 9, an experiment was conducted to examine the relationship between the flow rate of $NH_3$ gas, the pressure of the plasma generation area SP, and the gas flow conductance through the gas passage 55 of the partition plate 54. In this experiment, the pressure of the process field 5 was set at 0.1 Torr, and the temperature was set at 450° C. The opening ratio of the gas passage 55 of the partition plate 54 was set at three different values, 0.85%, 0.54%, and 0.31% (corresponding to values of the conductance, $15.2\times10^{-5}$, $9.26\times10^{-5}$, and $4.96\times10^{-5}$ m$^3$/sec, respectively). Further, the flow rate of $NH_3$ gas was set at two different values, 2.0 and 4.0 slm.

Figure 13:
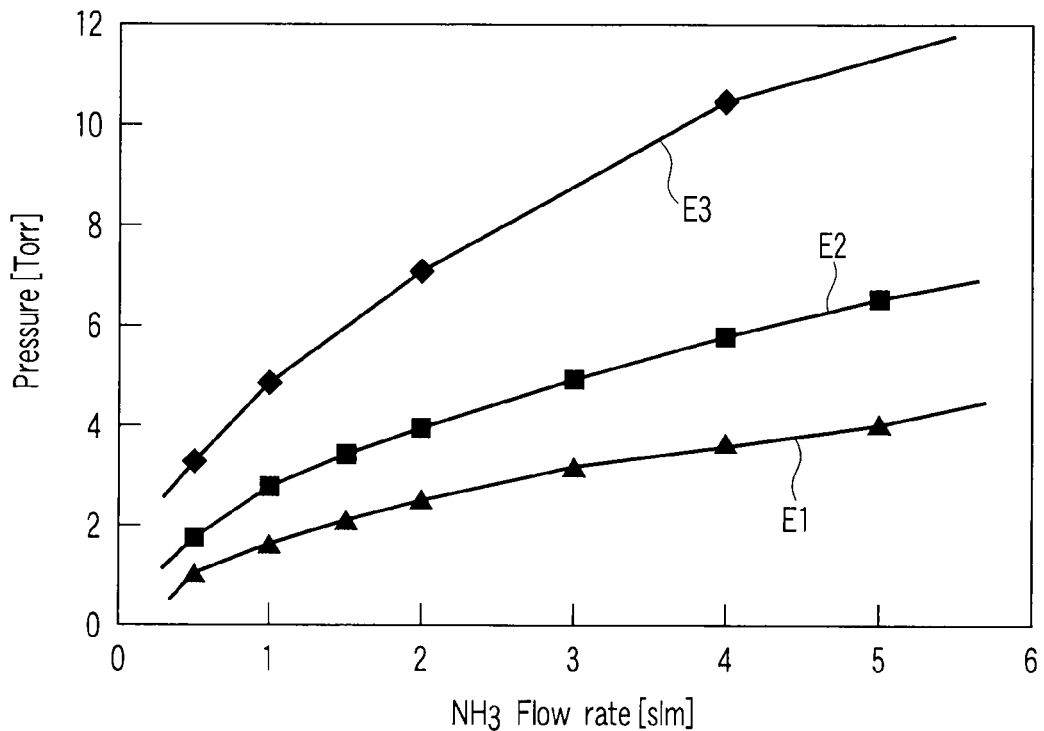
FIG. 13 is a graph showing the relationship between the flow rate of $NH_3$ gas, the pressure of a plasma generation area, and gas flow conductance, obtained by an experiment.
Figure 14:
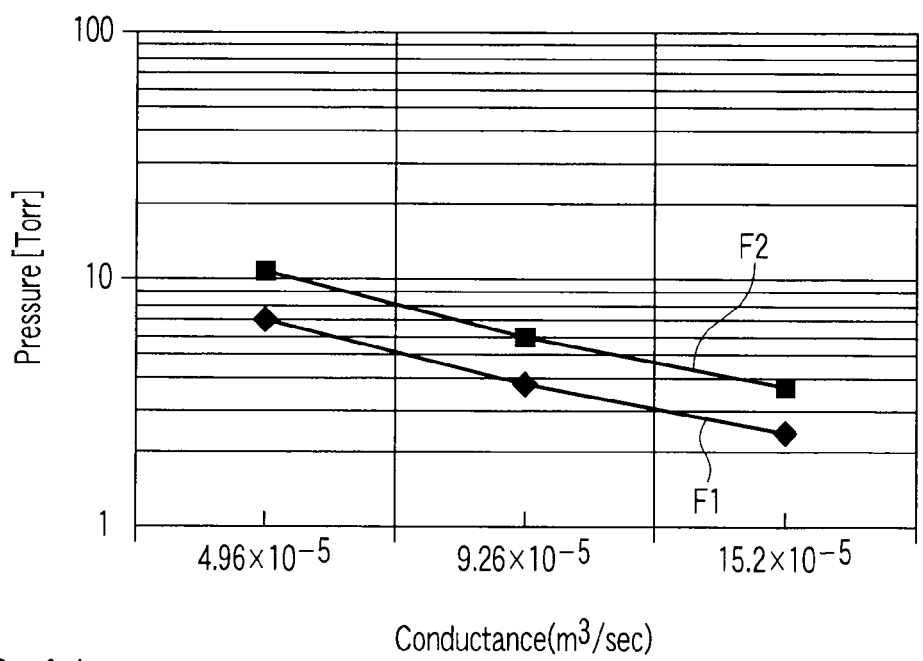
FIG. 14 is a graph formed by plotting part of the data shown in FIG. 13.

FIG. 13 is a graph showing the relationship between the flow rate of $NH_3$ gas, the pressure of the plasma generation area SP, and the gas flow conductance, obtained by this experiment. In FIG. 13, the horizontal axis denotes the flow rate of $NH_3$ gas (slm), and the vertical axis denotes the pressure of the plasma generation area SP (Torr). Further, a characteristic line E1 indicates the case of an opening ratio of 0.85% ($15.2\times10^{-5}$ m$^3$/sec), a characteristic line E2 indicates the case of an opening ratio of 0.54% ($15.2\times10^{-5}$ m$^3$/sec), and a characteristic line E3 indicates the case of an opening ratio of 0.31% ($4.96\times10^{-5}$ m$^3$/sec). FIG. 14 is a graph formed by plotting part of the data shown in FIG. 13. In FIG. 14, the horizontal axis denotes the gas flow conductance (m$^3$/sec) between the plasma generation area SP and process field 5, and the vertical axis denotes the pressure of the plasma generation area SP (Torr). Further, a characteristic line F1 indicates the case of an $NH_3$ flow rate of 2.0 slm, and a characteristic line F2 indicates the case of an $NH_3$ flow rate of 4.0 slm.

As shown in FIG. 13, with an increase in the flow rate of $NH_3$ gas, the pressure of the plasma generation area SP was almost linearly increased. It has been confirmed that, in order to maintain the pressure of the plasma generation area SP within a range of 2 to 5 Torr, the flow rate was preferably set to be within a range of about 1.5 to 6 slm in the case of the characteristic line E1, within a range of about 0.5 to 3 slm in the case of the characteristic line E2, and within a range of about 0.2 to 1.2 slm in the case of the characteristic line E3.

<Pressure Dependency of Etching Amount of Quartz Wall>

Using the apparatus shown in FIG. 9, an experiment was conducted to examine the pressure dependency of the etching amount of the quartz cover 56 defining the gas exciting section 50. In this experiment, the RF power was set at 500 W (watts), the flow rate of $N_2$ gas (supplied in place of $NH_3$) was set at 4 slm, and the process time was set at 10 min. The pressure inside the gas exciting section 50 (the pressure of the plasma generation area SP) was set at four different values, 0.5, 2.0, 5.0, and 10.0 Torr.

Figure 15:
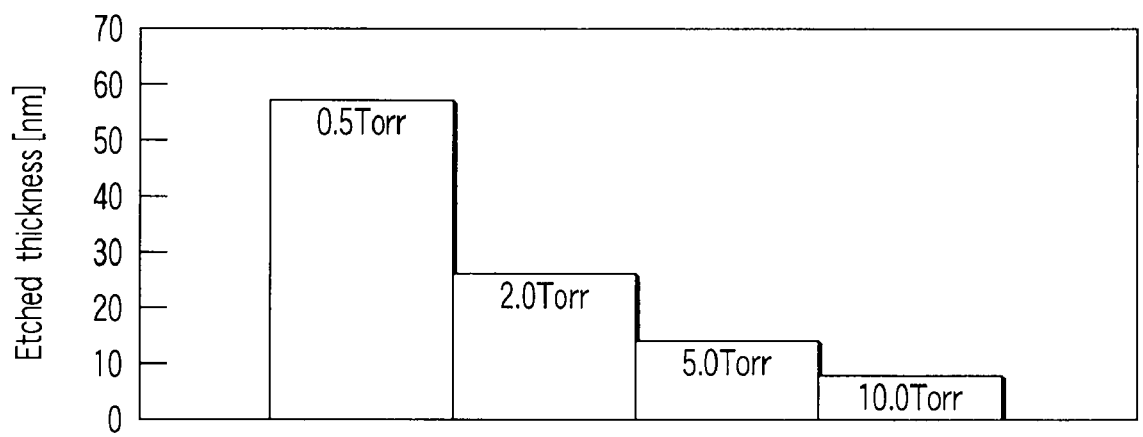
FIG. 15 is a graph showing a pressure dependency of the etching amount of a quartz wall, obtained by an experiment.

FIG. 15 is a graph showing the pressure dependency of the etching amount of the quartz wall, obtained by this experiment. In FIG. 15, the vertical axis denotes the etched thickness (nm) of the quartz wall. As shown in FIG. 15, with an increase in the pressure inside the gas exciting section 50, the etching amount was decreased. Particularly, within a pressure range of 2 to 5 Torr, the etching amount was 30 nm or less, which was a good result.

<Modification>

In the second embodiment described above, the gas distribution nozzle 34X of the second process gas is detachably inserted from below the gas exciting section 50. Alternatively, it may be arranged such that a gas distribution nozzle 34X is detachably inserted from above a gas exciting section 50.

In the first and second embodiments described above, the first process gas (containing DCS) that provides the main material of a thin film is not turned into plasma, and the second process gas (containing $NH_3$) that reacts with the first process gas is turned into plasma. However, depending on the type of CVD, only a gas that provides the main material of a thin film may be turned into plasma, or both of a gas that provides the main material of a thin film and a gas that reacts with the former gas may be turned into plasma. In any case, it suffices if the pressures of the plasma generation area SP and process field 5 can be set at their optimum pressure ranges, respectively.

The present invention may be applied to another plasma process, such as a plasma etching process, plasma oxidation/diffusion process, or plasma reformation process, in place of a plasma film formation process as described above. Further, the present invention may be applied to another target substrate, such as a glass substrate or ceramic substrate, in place of a semiconductor wafer as described above.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A vertical plasma processing apparatus for a semiconductor process, the apparatus comprising:

a process container having a process field configured to accommodate a plurality of target substrates at intervals in a vertical direction, a bottom end of the process container including a load port for loading and unloading the target substrates and a flange disposed around the load port, the process container and the flange consisting essentially of an insulative material and formed integrally with each other;

a support member configured to support the target substrates inside the process field and to be loaded and unloaded to and from the process container through the load port along with the target substrates supported on the support member;

a lid configured to close the load port through contact with the flange;

an exhaust system configured to exhaust gas from the process field;

an airtight auxiliary chamber defined by a casing projected from a side of the process container and consisting essentially of the insulative material, the auxiliary chamber including a plasma generation area extending over a length corresponding to the process field in a vertical direction;

an electric field generation mechanism provided to the process container and configured to generate a radio frequency (RF) electric field at the plasma generation area;

a gas passage located between the process field and the plasma generation area and disposed over a length corresponding to the process field in a vertical direction; and a process gas supply system configured to supply a process gas into the auxiliary chamber, such that the process gas is excited while passing through the plasma generation area, and is then supplied through the gas passage to the process field, the process gas supply system including a nozzle configured to supply the process gas into the auxiliary chamber, the nozzle extending in a vertical direction within the auxiliary chamber and including a plurality of gas spouting holes arrayed at intervals in a vertical direction over the process field, wherein an auxiliary insertion pipe consisting essentially of the insulative material is airtightly connected by welding between the casing of the auxiliary chamber and the flange, a lower end of the nozzle is connected to a gas head horizontally larger than the nozzle, and the flange has an insertion recess communicating with the auxiliary insertion pipe and configured to accommodate the gas head such that the insertion recess engages with the gas head to locate the gas head, the nozzle is inserted from below the flange through the insertion recess and the auxiliary insertion pipe into the auxiliary chamber, and the gas head is fixed in the insertion recess from below by a fixing device.

2. The apparatus according to claim 1, wherein the apparatus further comprises a partition plate consisting essentially of the insulative material, located between the process field and the plasma generation area, and including the gas passage formed therein, and the process container, the casing of the auxiliary chamber, and the partition plate are connected to each other by welding.

3. The apparatus according to claim 1, wherein the gas passage comprises a slit or slits extending in a vertical direction.

4. The apparatus according to claim 1, wherein the process container, the flange, the casing of the auxiliary chamber, and the auxiliary insertion pipe consist essentially of quartz.

5. The apparatus according to claim 1, further comprising:

a reinforcing ring member fitted on a periphery of the flange and including a through hole aligned with the insertion recess, wherein the fixing device is fitted in the through hole.

6. The apparatus according to claim 5, wherein the reinforcing ring member consists essentially of a stainless steel.

7. The apparatus according to claim 5, wherein the fixing device includes a retainer having a resilient structure and set in contact with a bottom of the gas head, and a screw member fitted in through hole below the retainer.

8. The apparatus according to claim 5, wherein the gas head has an opening on a side while the flange has an opening on a side to align with the opening of the gas head, and a gas line for supplying the process gas to the nozzle is attached to the flange by the reinforcing ring member and thereby connected to the opening of the flange.

9. A vertical plasma film formation apparatus for a semiconductor process, the apparatus comprising:

a process container having a process field configured to accommodate a plurality of target substrates at intervals in a vertical direction, a bottom end of the process container including a load port for loading and unloading the target substrates and a flange disposed around the load port, the process container and the flange consisting essentially of an insulative material and formed integrally with each other;

a support member configured to support the target substrates inside the process field and to be loaded and unloaded to and from the process container through the load port along with the target substrates supported on the support member;

a lid configured to close the load port through contact with the flange;

a heater configured to heat the target substrates inside the process field;

an exhaust system configured to exhaust gas from the process field;

an airtight auxiliary chamber defined by a casing projected from a side of the process container and consisting essentially of the insulative material, the auxiliary chamber including a plasma generation area extending over a length corresponding to the process field in a vertical direction;

an electric field generation mechanism provided to the process container and configured to generate a radio frequency (RF) electric field at the plasma generation area;

a gas passage located between the process field and the plasma generation area and disposed over a length corresponding to the process field in a vertical direction; and a process gas supply system configured to selectively supply into the process field a first process gas that provides a main material of a thin film and a second process gas that reacts with the first process gas, so as to deposit the thin film on the target substrates, the process gas supply system comprising a first nozzle disposed inside the process container and configured to supply the first process gas and a second nozzle opened to the auxiliary chamber and configured to supply the second process gas such that each of the first and second nozzles extends in a vertical direction and includes a plurality of gas spouting holes arrayed at intervals in a vertical direction over the plurality of target substrates, and the second nozzle supplies the second process gas into the auxiliary chamber for the second process gas to be excited while passing through the plasma generation area and then supplied through the gas passage into the process field, wherein an auxiliary insertion pipe consisting essentially of the insulative material is airtightly connected by welding between the casing of the auxiliary chamber and the flange, a lower end of the second nozzle is connected to a gas head horizontally larger than the second nozzle, and the flange has an insertion recess communicating with the auxiliary insertion pipe and configured to accommodate the gas head such that the insertion recess engages with the gas head to locate the gas head, the second nozzle is inserted from below the flange through the insertion recess and the auxiliary insertion pipe into the auxiliary chamber, and the gas head is fixed in the insertion recess from below by a fixing device.

10. The apparatus according to claim 9, wherein the apparatus further comprises a partition plate consisting essentially of the insulative material, located between the process field and the plasma generation area, and including the gas passage formed therein, and the process container, the casing of the auxiliary chamber, and the partition plate are connected to each other by welding.

11. The apparatus according to claim 9, wherein the gas passage comprises a slit or slits extending in a vertical direction.

12. The apparatus according to claim 9, wherein the process container, the flange, the casing of the auxiliary chamber, and the auxiliary insertion pipe consist essentially of quartz.

13. The apparatus according to claim 9, wherein the process gas supply system is configured such that the first process gas comprises a silicon source gas, and the thin film comprises a silicon-containing insulating film.

14. The apparatus according to claim 13, wherein the process gas supply system is configured such that the second process gas comprises ammonia gas, and the silicon-containing insulating film is a silicon nitride film.

15. The apparatus according to claim 9, further comprising:
 a reinforcing ring member fitted on a periphery of the flange and including a through hole aligned with the insertion recess,
 wherein the fixing device is fitted in the through hole.

16. The apparatus according to claim 15, wherein the reinforcing ring member consists essentially of a stainless steel.

17. The apparatus according to claim 15, wherein the fixing device includes
 a retainer having a resilient structure and set in contact with a bottom of the gas head, and
 a screw member fitted in through hole below the retainer.

18. The apparatus according to claim 15, wherein the gas head has an opening on a side while the flange has an opening on a side to align with the opening of the gas head, and a gas line for supplying the process gas to the second nozzle is attached to the flange by the reinforcing ring member and thereby connected to the opening of the flange.

* * * * *